US011287514B2

(12) United States Patent
Koers et al.

(10) Patent No.: US 11,287,514 B2
(45) Date of Patent: Mar. 29, 2022

(54) SENSOR DEVICE

(71) Applicant: Melexis Technologies NV, Tessenderlo (BE)

(72) Inventors: Gaetan Koers, Humbeek (BE); Wouter Leten, Mol (BE); Sam Maddalena, Zelem (BE); Ross Kay, Hatfield (GB)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 727 days.

(21) Appl. No.: 16/149,256

(22) Filed: Oct. 2, 2018

(65) Prior Publication Data

US 2019/0107604 A1    Apr. 11, 2019

(30) Foreign Application Priority Data

Oct. 11, 2017 (EP) ..................................... 17195999

(51) Int. Cl.
| G01S 7/481 | (2006.01) |
| G01S 17/02 | (2020.01) |
| H01L 31/12 | (2006.01) |
| H01L 27/146 | (2006.01) |
| G01S 17/04 | (2020.01) |

(52) U.S. Cl.
CPC .......... *G01S 7/4813* (2013.01); *G01S 7/4812* (2013.01); *G01S 17/04* (2020.01); *H01L 27/146* (2013.01); *H01L 31/12* (2013.01)

(58) Field of Classification Search
CPC .......... G01S 7/4813; G01S 7/481; G01S 7/48; G01S 7/4812; G01S 7/4811; G01S 17/04; G01S 17/02; H01L 27/146; H01L 27/14601; H01L 27/14627; H01L 31/12; H01L 31/125; H01L 27/14625; H01L 27/14618

See application file for complete search history.

(56) References Cited

U.S. PATENT DOCUMENTS

| 3,862,415 A | 1/1975 | Hamden, Jr. et al. |
| 4,460,259 A | 7/1984 | Greivenkamp, Jr. et al. |
| 8,704,262 B2 * | 4/2014 | Livesay .................... F21K 9/20 257/98 |

(Continued)

FOREIGN PATENT DOCUMENTS

WO    WO-2017068199 A1    4/2017

OTHER PUBLICATIONS

European Search Report dated Mar. 16, 2018.

*Primary Examiner* — John R Lee
(74) *Attorney, Agent, or Firm* — Harness, Dickey & Pierce, P.L.C.

(57) ABSTRACT

A sensor device (100) comprises an emitter device (106) arranged to emit electromagnetic radiation and having an emission region associated therewith. The sensor device (100) also comprises a detector device (108) arranged to receive electromagnetic radiation and having a detection region associated therewith, and an optical system (122). The emission region is spaced at a predetermined distance from the detection region. The optical system (122) defines a plurality of principal rays, a number of the plurality of principal rays intersecting the detection region. The number of the plurality of principal rays also intersect the emission region.

15 Claims, 3 Drawing Sheets

(56) References Cited

U.S. PATENT DOCUMENTS

| | | | |
|---|---|---|---|
| 2014/0071427 A1* | 3/2014 | Last | G01C 25/00 |
| | | | 356/4.01 |
| 2014/0362051 A1 | 12/2014 | Gomez et al. | |
| 2015/0229101 A1* | 8/2015 | Skidmore | H01S 5/024 |
| | | | 372/36 |
| 2015/0229912 A1* | 8/2015 | Masalkar | G01S 7/481 |
| | | | 348/46 |
| 2016/0025855 A1 | 1/2016 | Camarri et al. | |
| 2016/0306031 A1* | 10/2016 | Caley | G01S 17/08 |
| 2017/0082486 A1* | 3/2017 | Send | G01S 13/867 |
| 2017/0219709 A1* | 8/2017 | Send | G01S 17/42 |
| 2017/0244490 A1* | 8/2017 | Hallal | H04B 10/40 |
| 2018/0278019 A1* | 9/2018 | Yamauchi | H01S 5/068 |
| 2018/0316158 A1* | 11/2018 | Yoon | H01S 5/423 |
| 2019/0107604 A1* | 4/2019 | Koers | H01L 27/146 |
| 2019/0120962 A1* | 4/2019 | Gimpel | G01S 7/4812 |

* cited by examiner

SENSOR DEVICE

FIELD OF THE INVENTION

The present invention relates to a sensor device of the type that, for example, comprises an emitter device for emitting electromagnetic radiation and a detector device for receiving a portion of the electromagnetic radiation reflected by a target.

BACKGROUND OF THE INVENTION

In so-called time-of-flight sensing systems and other systems, for example night vision systems, it is known to employ an illumination source to illuminate a surrounding environment within a field of view of the illumination source, sometimes known as a "scene". International patent publication no. WO 2017/068199 describes an approach that relies on the projection of discrete spots of laser light onto a scene of interest. Such an illumination technique requires the use of large and dedicated projection optics to achieve adequate beam shaping, which limits miniaturisation of such systems and so integration into, for example, mass-produced commercial vehicles. Also, it is desirable to reduce the bill of materials associated with implementing such a sensor system. Furthermore, due to mechanical constraints, the device that emits the laser light needs to be physically separated far enough from the device that detects the reflected light. In this respect, the minimum separation distance between the centre of an emitter and a detector is typically the sum of the radii of their respective lens assemblies.

US patent publication no. US 2016/0025855 and U.S. Pat. No. 4,460,259 disclose time-of-flight solutions where the light emitter and the detector are separated. U.S. Pat. No. 4,460,259 mitigates the above-mentioned mechanical constraints by both the emitter and detector sharing the same optics. However, due to the generally reciprocal nature of the design of such optics, a reflected signal from the reflecting target is primarily focused back onto the emitter and not onto the detector. By intentionally de-focusing the lens or by virtue of the imperfect nature of the lens assembly, a part of the reflected light can be incident on the detector, but the amount of reflected light incident upon the detector is only a small proportion of the overall light reflected by the reflecting target and so the efficiency of the sensor is described in U.S. Pat. No. 4,460,259 is limited. Also, integrating a highly sensitive detector and a powerful emitter or emitter driver on the same semiconductor substrate poses significant challenges in terms of electrical, optical and thermal noise coupling, such noise components being highly undesirable.

US 2016/0025855 discloses two beam shaping lenses, an emitter channel lens and a detection channel lens, which provide sufficiently small and simple emitting and detecting surfaces, for example of the order of 10 µm to 1 mm, to be integrated within an Integrated Circuit (IC) package, the angular resolution per pixel provided being of the order of few degrees at most, and the detection range being of the order of 10 m. However, when either the detector or the emitter comprises many elements, for example hundreds of elements or more, the angular resolution per pixel needs to be better than, for example 1°, or the receiving aperture needs to be large enough to detect reflections from a target at a distance of, for example, greater than about 10 metres, and this increases the complexity and size of the optics required to collect and focus the light. Therefore, the integration approach described is not viable for sensor implementations employing a large number of elements as described above.

The physical distance between the emitter lens and the receiving lens also gives rise to parallax errors, which limits the operating distance range of known sensors, especially at close range. To mitigate this problem, it is known to employ projecting optics, rotating mechanical mirrors or microelectromechanical systems (MEMS) mirrors can be used to scan a laser spot across a scene, but such systems require very complex electronics to control the angle of the laser beam. Alternatively, illumination without a focusing lens, the so-called "flash" approach, is another known illumination technique, but suffers from a greatly reduced SNR (greater than 10 times less) for the same average emitted power by other known illumination techniques. An alternative illumination technique comprises an array of laser sources, for example a Vertical Cavity Surface Emitting Laser (VCSEL) array, where each emitter is coupled to a miniature lens. However, such an approach does not satisfy a sufficient beam collimation requirement of time-of-flight illumination systems relying on structured light pattern projection due to the limited size of each miniature lens.

BRIEF SUMMARY OF THE INVENTION

According to a first aspect of the present invention, there is provided a sensor device comprising: an emitter device arranged to emit electromagnetic radiation and having an emission region associated therewith; a detector device arranged to receive electromagnetic radiation and having a detection region associated therewith; an optical system; characterised in that: the emission region is spaced at a predetermined distance from the detection region; the optical system defines a plurality of principal rays, a number of the plurality of principal rays intersecting the detection region; and the number of the plurality of principal rays also intersect the emission region.

The emitter device may be disposed between the detector device and the optical system.

The detector device may be disposed between the emitter device and the optical systems.

The emitter device may have principal rays in common with the detector device with respect to the optical system.

The predetermined distance may be selected so as to minimise shadowing of the detection region by the emitter device.

The predetermined distance may be selected so that less than substantially 5% of the light directed towards the detection region may be shadowed by the emission region.

The emitter device may be a point emitter of electromagnetic radiation.

The device may further comprise: an electrical coupling to the emitter device for providing power; the electrical coupling may be arranged to provide a thermal load, thereby reducing, when in use, thermal resistance between the emitter device and an environment in which the emitter device is disposed.

The emitter device may be disposed adjacent the detector device.

The device may further comprise: a semiconductor substrate comprising the detector device disposed thereon or at least partly therein; and a driver circuit; wherein the emitter device may be operably coupled to the driver circuit; the semiconductor substrate may comprise the driver circuit disposed thereon or at least partly therein.

The detector device may be disposed between the semiconductor substrate and the emitter device.

The device may further comprise: a semiconductor substrate comprising the emitter device disposed thereon or at least partly therein; and a driver circuit; wherein the emitter device may be operably coupled to the driver circuit; the semiconductor substrate may comprise the emitter circuit disposed thereon or at least partly therein.

The emitter device may be disposed between the semiconductor substrate and the detector device.

The device may further comprise: a supporting substrate provided opposite the detector device; the supporting substrate may have an inwardly facing surface and an outwardly facing surface. The inwardly facing surface may be in spaced relation to the detector device and the outwardly facing surface may carry the emitter device.

The supporting substrate may be elongate. The outwardly facing surface may be substantially planar. The supporting substrate may be a bridging structure.

The supporting substrate may be light transmissive and/or wavelength selective.

The supporting substrate may be formed from glass or coated glass or a plastics material or a coated plastics material.

The device may further comprise an optical element adjacent and optically coupled to the emitter device.

The optical element may be a lens coupled to the emitter device.

The device may further comprise: an array of emitter devices comprising the emitter device.

The may further comprise: an array of detector devices comprising the detector device.

According to a second aspect of the present invention, there is provided a time of flight measurement system comprising the sensor device as set forth above in relation to the first aspect of the invention.

According to a third aspect of the present invention, there is provided a night vision system comprising the sensor device as set forth above in relation to the first aspect of the invention.

According to a fourth aspect of the present invention, there is provided a LIDAR system comprising the sensor device as set forth above in relation to the first aspect of the invention.

It is thus possible to provide a sensor device employing shared optics. The use of shared optics by the detector devices and the emitter devices enables larger optical components to be employed, thereby supporting an improved signal-to-noise ratio of a detection signal. In this regard, the sensor device permits an increased amount of reflected light to be received by the detector devices of the sensor device. Angular resolution of the sensor device is also improved. The sensor device also does not require complex control electronics to control the emitter device(s) and required beam collimation can be achieved. Furthermore, the sensor device is economic to manufacture. Additionally, owing to, for example, the spacing between the emitter device and the detector device and the effect of lens focusing, the sensor device no longer requires the emitter surface of the emitter device to be smaller in surface area than the detector surface of the detector device.

BRIEF DESCRIPTION OF THE DRAWINGS

At least one embodiment of the invention will now be described, by way of example only, with reference to the accompanying drawings, in which.

DETAILED DESCRIPTION OF THE INVENTION

Figure 1:
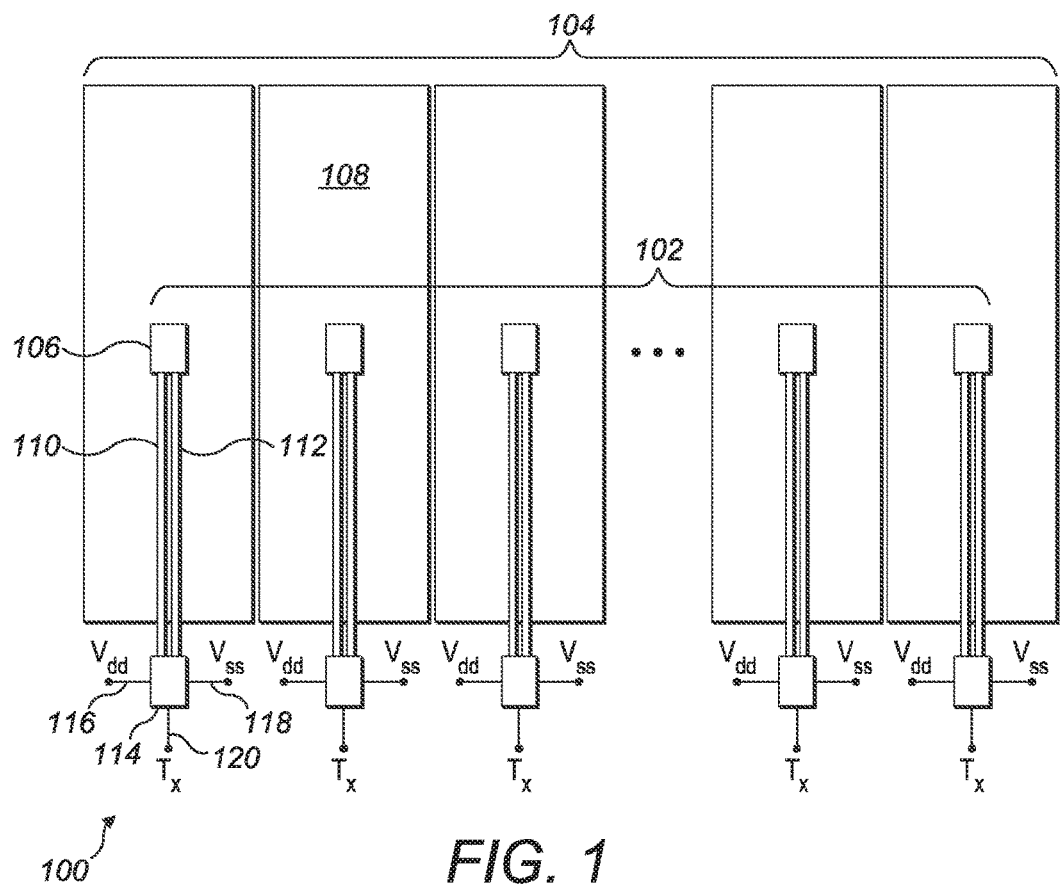
FIG. 1 is a plan view of a sensor device constituting an embodiment of the invention.

Throughout the following description identical reference numerals will be used to identify like parts.

Time-of-flight measurement systems and other systems, for example night vision system, comprise one of more sensor devices, for example optical sensor devices. Referring to FIG. 1, a sensor device 100 comprises, in this example, a plurality of emitter devices 102 for emitting electromagnetic radiation, for example light, for example an array of emitter devices, and a plurality of detector devices 104 for detecting electromagnetic radiation, for example light, for example an array of detector devices. The plurality of emitter devices 102 respectively have an emitter region from which the light is emitted, and the plurality of emitter devices 102 respectively reside on a first surface. The plurality of detector devices 104 respectively have a detector region through which light to be detected propagates, and the plurality of detector devices 104 respectively reside in a second surface.

The plurality of emitter devices 102 is arranged as an array and similarly the plurality of detector devices 104 is arranged as an array. It should, however, be appreciated that other embodiments, including the ones described herein, can be based upon different numbers of emitter devices and/or different numbers of detector devices. For example, the sensor device can comprise one emitter device and one detector device, or one emitter device and multiple detector devices. Alternatively, multiple emitter devices in combination with a single detector device can be employed. As can be seen, a greater number of one kind of device can be provided than the other kind of device.

Referring back to FIG. 1, in this example, each emitter device 106 is aligned, for example in registry with each detector device 108 and constitutes a point source-like emitter. Each emitter device 106 is disposed adjacent each detector device 108 or is disposed opposite each detector device 108 in spaced relation thereto. Each emitter element 106 comprises a respective first electrical connection 110 thereto and a second electrical connection 112 thereto in order to drive each emitter device 106. In some embodiments, the respective first electrical connection 110 and/or the respective second electrical connection can additionally serve as a thermal load, thereby reducing thermal resistance between the emitter device 108 and an environment in which the emitter is disposed. The skilled person should also appreciate that in some embodiments, a greater number of electrical connections can be employed depending upon the type of emitter device employed in the sensor device 100, for example where the emitter device comprises a plurality of light sources, such as a plurality of light sources disposed in parallel.

A driver circuit 114 is respectively provided for each emitter device 106. Each driver circuit 114 comprises a first supply terminal 116 and a second supply terminal 118 for providing a supply voltage and a control terminal 120 for controllably placing the emitter device 106 into an active range of operation where stimulated emission occurs. Although not shown, the detector devices 108 comprise respective terminals so that an output signal can be obtained, the terminals of the detector devices 108 and the emitter devices 106 being operably coupled to a control circuit of the sensor device 100. In this respect, the control circuit is arranged to control the emitter devices 106 and the detector devices 108 in synchronism so as to control collection of light, reading out output signals generated by one or more of the detector devices 108 for storage, digitisation and/or further processing. In some embodiments, the control circuit can be provided external to the sensor device 100, for example on an application Printed Circuit Board (PCB).

In this example and others set forth herein, each emitter device 106 is respectively disposed in front of each detector device 108, the front-facing side of the sensor device 100 being the side of the sensor device 100 through which electromagnetic radiation emitted by the emitter element 106 propagates. In this regard, the front-facing side of the sensor device 100 is the side from above in the plan view of FIG. 1.

Hereafter, for simplicity of description, reference to the emitter devices 106 and the detector devices 108 will be in the singular. However, the skilled person will appreciate that a greater number of emitter devices and/or detector devices can be intended, depending upon the context of the embodiment being described.

Figure 2:
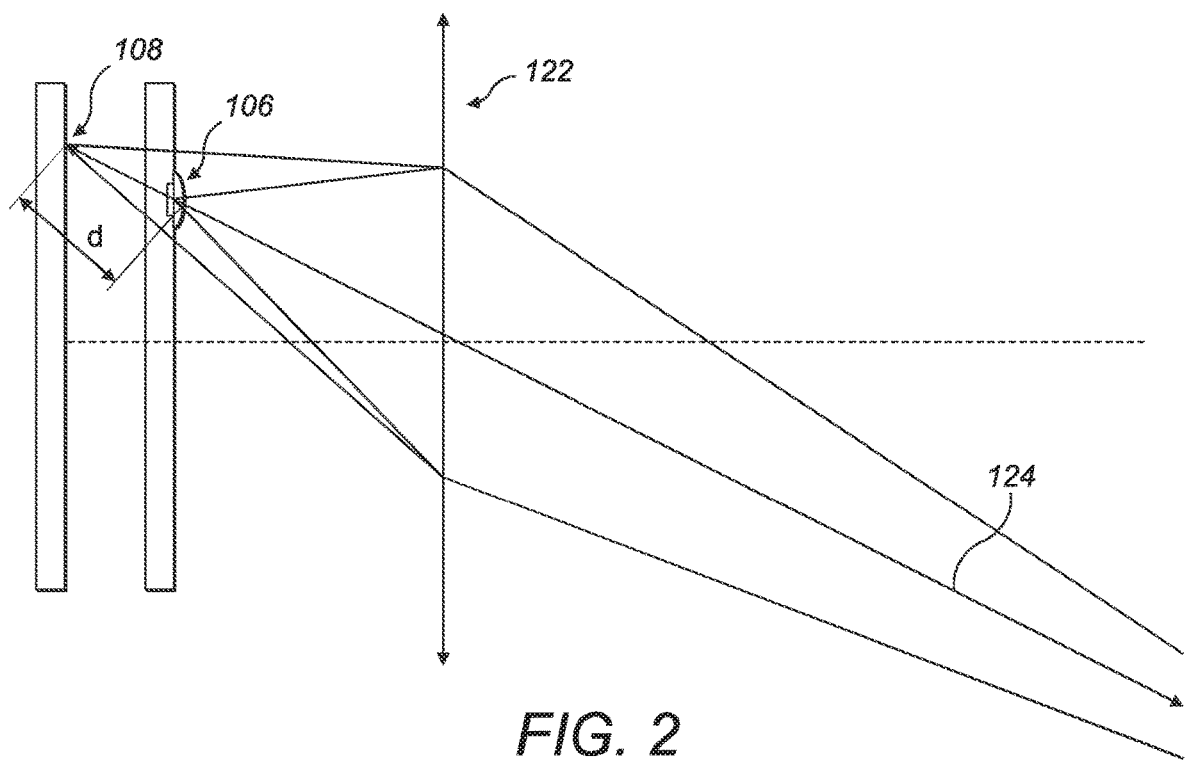
FIG. 2 is a side elevation of the sensor device of FIG. 1.

Turning to FIG. 2, the emitter device 106 is spaced from the detector device 108 by a predetermined distance, d, and an optical system comprising, for example, one or more lenses 122 is disposed opposite the emitter device 106 so that, in this example, the emitter device 106 is located between the detector device 108 and the optical system 122. The rays of FIG. 2 include a principal ray 124, which is shared by both the detector device 108 and the emitter device 106. For the avoidance of doubt, the sensor device 100 comprises the optical system 122. As will be appreciated by the skilled person, a plurality of principal rays exists in respect of the sensor device 100. A number of the plurality of principal rays is shared by both the emitter device 106 and the detector device 108. However, some of the number of principal rays are obscured from the detector device 108 by the emitter device 106, which is disposed in front of the detector device 108. In this respect, the number of the plurality of principal rays intersecting both the first and second surfaces mentioned above, for example the emitter device and the detector device have principal rays in common with respect to the optical system 122.

In this, and other, example, the predetermined distance, d, is measured substantially from a point of intersection of a central shared principal ray with a surface of the emitter region of a given emitter device 106 and another point of intersection of the central ray with a surface of the detector region of a given detector device 108 associated with the given emitter device 106. In this regard, it should be appreciated that the surface of the emitter region and/or the surface of the detector region can be curved as a result, for example, of a covering lens element or other optical element.

In this respect, the predetermined distance and/or the area of the emitter device 106 are/is selected so that less than about 5% of light emitted by the emitter device 106 and reflected by a target (not shown) is prevented from reaching the detector device 108 by the presence of the emitter device 106. The objective of such measures is to minimise shadowing of the detector surface by the emitter device 106. In this regard, the emission areas and detection areas can be sized differently to satisfy implementation requirements, based upon the predetermined distance.

Figure 3:
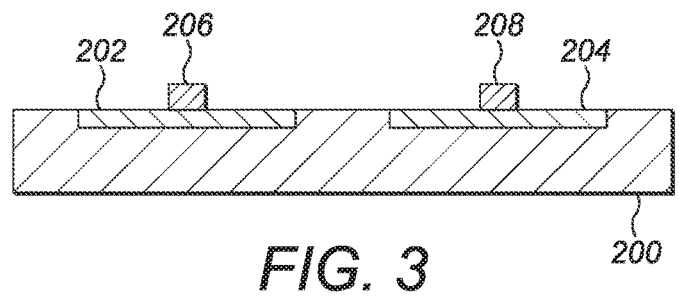
FIG. 3 is a schematic diagram of the sensor device of FIGS. 1 and 2 constituting an embodiment of the invention.

In an embodiment (FIG. 3), the above-mentioned structure is implemented using Complementary Metal Oxide Semiconductor (CMOS) technology. In this regard, a semiconductor wafer comprises a substrate 200, for example a silicon or gallium arsenide substrate, grown using any suitable semiconductor processing technique. Detector devices are then formed on or in the substrate, for example a first detector device 202 and a second detector device 204, again employing any suitable semiconductor processing technique. Thereafter, emitter devices, for example Light Emitting Diode devices or laser devices, such as Vertical Cavity Surface Emitting Lasers (VCSELs), are respectively formed on the detector devices, for example a first emitter device 206 is formed on the first detector device 202 and a second emitter device 208 is formed on the second detector device 204 so that the first emitter device 206 is adjacent the first detector device 202 and the second emitter device 208 is adjacent the second detector device 204. In this example, and indeed others described herein, the emitter devices and/or driver circuits (not shown) are integrated onto the surface of the semiconductor wafer comprising the detector devices, thereby reducing electrical, optical and thermal noise coupling from the emitter devices to the detector devices. It should be appreciated that, in this and other embodiments, the emitter devices can be formed, for example, using any suitable printing or deposition technique. One exemplary formation of the emitter devices comprises the emitter devices being respectively heterogeneously integrated onto semiconductor detector devices or a supporting glass wafer.

Figure 4:
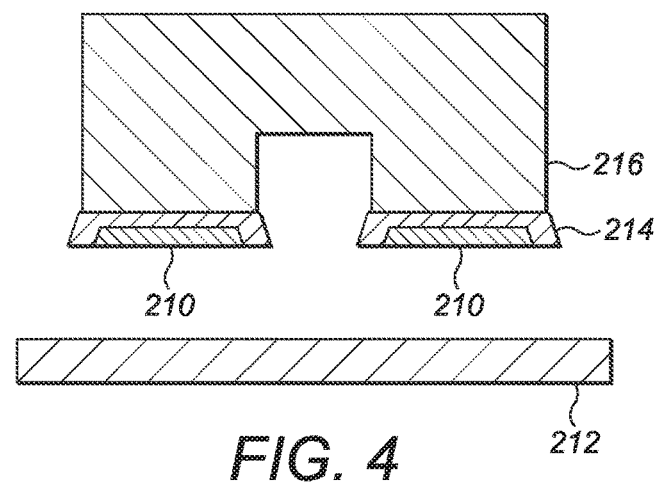
FIGS. 4 to 6 are schematic diagrams of stages of manufacture of the sensor device of FIG. 3.
Figure 5:
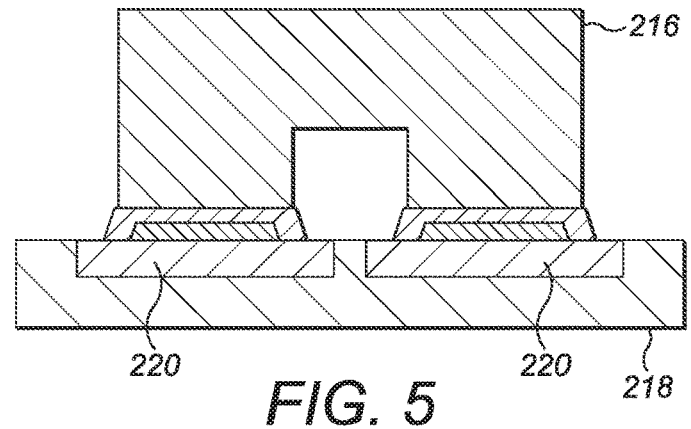
Figure 6:
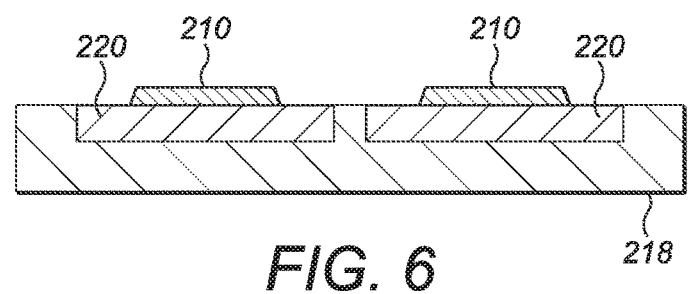

In another embodiment, instead of employing traditional semiconductor processing techniques to form the sensor device, a micro-transfer printing technique can be employed. In this regard, referring to FIG. 4, emitter devices 210 are fabricated on a native semiconductor substrate 212, for example a wafer formed from a III-V semiconductor material, such as a 102 mm (4 inch) wafer, using any suitable semiconductor processing technique, so that neighbouring emitter devices are spaced a sufficient distance apart such that when mated with detector devices, the emitter devices will be in registry with the detector devices. The emitter devices 210 are encapsulated in a polymer layer 214, for example photoresist. A transfer device 216 is employed to pick up the emitter devices 210 and transfer the emitter devices 210 (FIG. 5) to a recipient substrate, for example a semiconductor substrate 218 having the detector devices 220 formed therein, such as a CMOS or MEMS wafer, such as a 203 mm (8 inch) wafer. The emitter devices 210 are placed onto the detector devices 220 using any suitable technique so that the emitter devices 210 are respectively adjacent the detector devices 220 (FIG. 6). Post-processing is subsequently performed in order to connect electrically the printed emitter devices 210 to the surface of the wafer or to passivate the surface of the wafer. In this regard, the printed emitter devices 210 can be electrically connected to the surface of the wafer using any suitable technique employing, for example a mask. For example, the connections can be implemented using a vacuum deposition or metal evaporation technique. Alternatively, a sputter deposition technique can be employed, or a metal layer can be electroplated, preceded by deposition of a catalyst. Another technique to provide the connections can be by way of printing of conductive inks, using for example inkjet printing or spray coating techniques. Chemical vapour deposition is a technique that can also be employed to form the connections using precursors activated by temperature or electromagnetic energy to form a metal layer.

Figure 7:
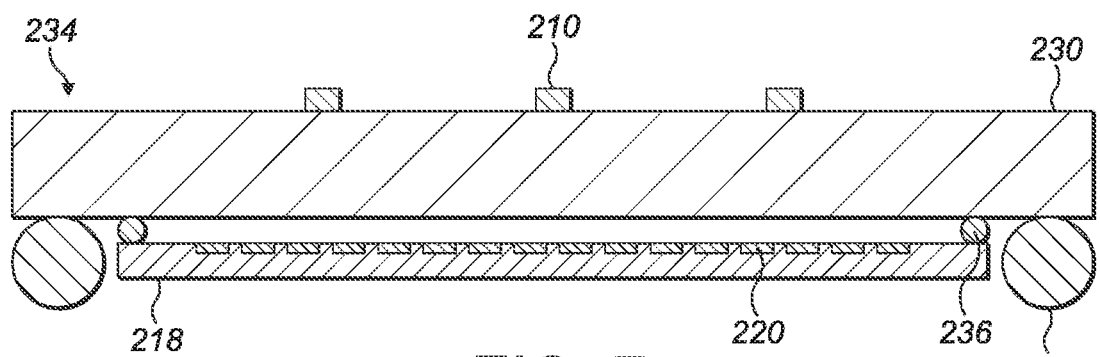
FIG. 7 is a schematic diagram of the sensor device of FIGS. 1 and 2 constituting another embodiment of the invention.

In another embodiment (FIG. 7), a supporting structure that is separate from the semiconductor substrate 218 is provided in order to maintain the emitter devices 210 is spaced relation opposite to the detector devices 220, for example a supporting substrate, such as a bridging substrate 230, such as a light-transmissive substrate. Examples of light-transmissive substrates include glass substrates and coated glass substrates or any other suitable light-transmissive material, such as a plastics material. The coating employed can be any suitable coating desired, for example an anti-reflective coating or an optical filter coating. In any suitable embodiment, the light-transmissive substrate can be formed so as to support one or more optical function for example, a function to focus light to a detection region, i.e. lensing. In this respect, the light-transmissive substrate can comprising one or more Fresnel lenses.

In this example, the substrate 218 comprising the detector devices 220 is disposed below the bridging substrate 230, the bridging substrate 230 being operably coupled to the application PCB mentioned above to which the sensor device 100 is to be coupled, for example using solder bumps 232. The emitter devices 210 are disposed, for example by micro-printing the emitter devices 210 onto the bridging substrate 230, on an outwardly facing surface 234 of the bridging substrate 230, corresponding to the front-facing side of the sensor device 100, and arranged so as to be in registry with the detector devices 220 below the emitter devices 210. The outwardly facing surface 234 thus carries the emitter device 210. An inwardly facing surface of the bridging substrate faces opposite the detector devices 220. The bridging substrate 230 is also, in this example, electrically coupled to the substrate 218 by interconnections 236, for example solder balls or leads. Interconnects, for example metallic interconnects, are provided on the outwardly facing surface 234 of the bridging substrate 230 in order to provide electrical connections to the emitter devices 210. The bridging substrate 230 can be formed so as to have any desired shape. For example, the bridging substrate 230 can be elongate and the outwardly facing surface 234 can be substantially planar.

Figure 8:
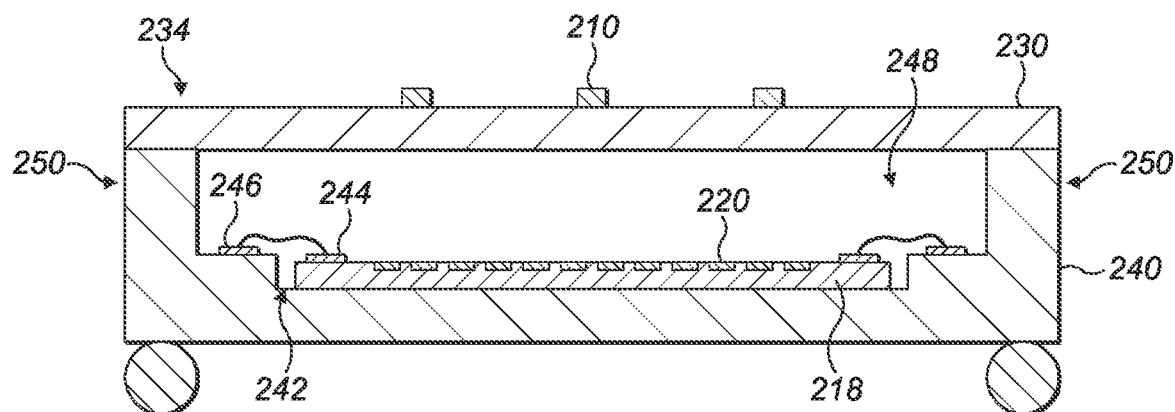
FIG. 8 is a schematic diagram of the sensor device of FIGS. 1 and 2 constituting a further embodiment of the invention.

Referring to FIG. 8, in a further embodiment, a cradle package 240 is provided having a recessed base portion 242 for receiving the substrate 218 comprising the detector devices 220. In this example, the cradle package 240 is formed from a ceramic or plastics material, but the skilled person will appreciate that any suitable material can be employed to form the cradle package 240 in this and any other embodiment. The substrate 218 comprises contacts 244 that are operably coupled to corresponding contacts 246 on the package 240, for example by wire bonds, in order to support electrical connection to the application PCB described above, for example via solder bumps 232 that are electrically connected to the package 240. The cradle package 240 defines an open cavity 248 that is closed when the bridging substrate 230 is connected to side walls 250 of the package 240, or any other suitable part of the package 240. The emitter devices 210 are deposited on the bridging substrate 230 in the manner described above in relation to FIG. 7 and electrical connections between the outer-facing surface 234 of the bridging substrate 230 and the emitter devices are provided by, for example, wire bonds and/or solder bumps (not shown).

Figure 9:
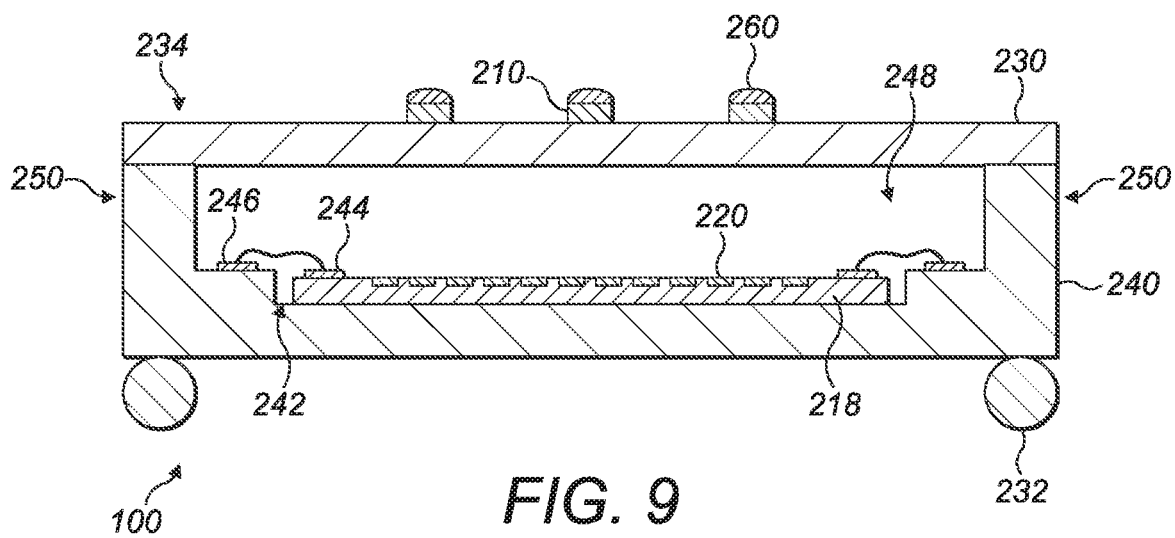
FIG. 9 is a schematic diagram of the sensor device of FIGS. 1 and 2 constituting yet another embodiment of the invention.

The exemplary embodiments of the invention set forth above are considered to be illustrative and not limiting. Various changes to the described embodiments may be made without departing from the spirit and scope of the invention. For example, turning to FIG. 9, in yet another embodiment, the sensor device 100 of FIG. 8 described above can be enhanced by providing respective optical elements, for example miniature lenses 260 respectively adjacent the emitter devices 210, such as microlenses, in order to enhance coupling of light emitted by each of the emitter devices 210 towards the optical system 122. In other embodiments, the supporting structure can additionally or alternatively be wavelength selective.

In other embodiments, any of the above embodiments, where possible, can be arranged so that the one or more of the emitter devices 106 can be disposed behind the one or more of the detector devices 108 with respect to the front-facing side of the sensor device 100. In such embodiments, the detector device or devices 108 is/are disposed between the optical system 122 and the emitter device or devices 106.

It should be appreciated that references herein to "light", other than where expressly stated otherwise, are intended as references relating to the optical range of the electromagnetic spectrum, for example, between about 350 nm and about 2000 nm, such as between about 550 nm and about 1400 nm or between about 600 nm and about 1000 nm or between about 850 nm and about 1550 nm, such as between about 905 nm and about 940 nm.

What is claimed is:

1. A sensor device comprising:
an emitter device arranged to emit electromagnetic radiation and having an emission region associated therewith;
a detector device arranged to receive electromagnetic radiation and having a detection region associated therewith; and
an optical system, wherein
the emission region is spaced at a predetermined distance from the detection region;
the optical system defines a plurality of principal rays, a number of the plurality of principal rays intersecting the detection region; the number of the plurality of principal rays also intersect the emission region; and
the optical system is shared by the emitter device and the detector devie.

2. The device according to claim 1, wherein the emitter device is disposed between the detector device and the optical system.

3. The device according to claim 2, wherein the predetermined distance is selected so as to minimise shadowing of the detection region by the emitter device.

4. The device according to claim 3, wherein the predetermined distance is selected so that less than substantially 5% of the light directed towards the detection region is shadowed by the emission region.

5. The device according to claim 1, further comprising:
an electrical coupling to the emitter device for providing power, the electrical coupling being arranged to provide a thermal load, thereby reducing, when in use, thermal resistance between the emitter device and an environment in which the emitter device is disposed.

6. The device according to claim 1, wherein the emitter device is disposed adjacent the detector device.

7. The device according to claim 1, further comprising:
a semiconductor substrate comprising the detector device disposed thereon or at least partly therein; and
a driver circuit; wherein
the emitter device is operably coupled to the driver circuit;
the semiconductor substrate comprises the driver circuit disposed thereon or at least partly therein.

8. The device according to claim 1, further comprising:
a semiconductor substrate comprising the emitter device disposed thereon or at least partly therein; and
a driver circuit; wherein
the emitter device is operably coupled to the driver circuit;
the semiconductor substrate comprises the emitter circuit disposed thereon or at least partly therein.

9. The device according to claim 1, further comprising:
a supporting substrate provided opposite the detector device, the supporting substrate having an inwardly facing surface and an outwardly facing surface, the inwardly facing surface being in spaced relation to the detector device and the outwardly facing surface carrying the emitter device.

10. The device according to claim 9, wherein the supporting substrate is light transmissive and/or wavelength selective.

11. The device according to claim 9, wherein the supporting substrate is formed from glass or coated glass or a plastics material or a coated plastics material.

12. The device according to claim 1, further comprising an optical element adjacent and optically coupled to the emitter device.

13. The device according to claim 12, wherein the optical element is a lens coupled to the emitter device.

14. The device according to claim 1, further comprising:
an array of emitter devices comprising the emitter device.

15. The device according to claim 1, further comprising:
an array of detector devices comprising the detector device.

* * * * *